United States Patent [19]
Ishiguro et al.

[11] Patent Number: 5,065,112
[45] Date of Patent: Nov. 12, 1991

[54] AMPLIFICATION CIRCUIT WITH IMPROVED LINEARITY

[75] Inventors: Kazuhisa Ishiguro, Nitta; Yasunori Sato, Oizumi, both of Japan

[73] Assignee: Sanyo Electric Co., Ltd., Moriguchi, Japan

[21] Appl. No.: 604,292

[22] Filed: Oct. 29, 1990

[30] Foreign Application Priority Data

Oct. 31, 1989 [JP] Japan .................................. 1-283904
Nov. 6, 1989 [JP] Japan .................................. 1-288248

[51] Int. Cl.[5] .............................................. H03F 3/45
[52] U.S. Cl. .................................. 330/260; 307/494; 307/529
[58] Field of Search ................ 307/494, 529; 330/252, 330/257, 260, 261, 311

[56] References Cited

U.S. PATENT DOCUMENTS 4,568,840 2/1986 Kenji .............................. 307/494 X
4,694,204 9/1987 Nishijima et al. ............... 307/529 X Primary Examiner—Steven Mottola
Attorney, Agent, or Firm—Armstrong, Nikaido, Marmelstein, Kubovcik & Murray

[57] ABSTRACT

An amplification circuit including a differential amplifier is disclosed. An npn transistor portion of the differential amplifier has its base provided with negative feed back, the base potential is brought to a constant potential, i.e. a virtual ground potential. The voltage between the base and emitter of the transistor is thus kept constant, and the internal resistance of the emitter does not change in accordance with the change of the emitter current. As a result, since the transistor responds only to an input signal current converted by a resistor and operates, the linearity between the input and the output of the differential amplifier is improved.

8 Claims, 4 Drawing Sheets

AMPLIFICATION CIRCUIT WITH IMPROVED LINEARITY

BACKGROUND OF THE INVENTION

1. Field of the Invention

This invention generally relates to an amplification circuit, and particularly relates to an amplification circuit with improved linearity. This invention has particular applicability to an amplification circuit which includes a differential amplifier.

2. Description of the Background Art

Generally, in an amplification circuit, linearity is required between an input signal and an output signal through a wide range of input signal levels. For example, a receiving circuit for use in a cordless telephone, a transceiver or a similar device is provided with an amplification circuit for amplifying received voice signals.

Generally, some noise other than a voice signal is included in a received radiowave. This means that when the level of the voice signal is low, the noise becomes relatively more prominent compared to the voice signal. It is therefore necessary to amplify the voice signal by the amplification circuit. In particular, as the voice signal changes over a wide range of signal level, the amplification circuit is required to have a wide dynamic range, i.e. linearity between the input and output.

A differential amplifier is frequently used in an amplification circuit for various electrical signals, including the amplification circuit for the above mentioned voice signal. However, since a differential amplifier typically has non-linearity between the input signal and the output signal, it can often introduce distortion into the amplified voice signal.

FIG. 1 is a circuit diagram of a conventional amplification circuit utilizing a differential amplifier as discussed above. The amplification circuit includes a first differential amplifier having of npn transistors 1 and 2, constant current sources 3 and 4, and resistor 5; a second differential amplifier having diodes 6 and 7 for converting an output signal generated from the differential amplifier into a logarithmic signal, npn transistors 8 and 9 and a variable current source 10, and a current mirror circuit composed of pnp transistors 11 and 12. The second differential amplifier and the current mirror circuit form an exponential conversion circuit for exponent-converting a logarithm converted signal.

Transistor 1 has its base connected to receive an input signal V. Transistor 2 has its base connected to receive a predetermined constant voltage $V_B$. Transistor 1 is grounded through a constant voltage source 3 with an emitter capable of passing a constant current $I_D$. Transistor 2 is grounded through a constant current source 4 with an emitter capable of passing a constant current $I_D$. Resistor 5 is connected between the emitters of the transistors 1 and 2. Resistor 5 is provided to increase the gain of the first differential amplifier.

Diodes 6 and 7 are connected between a power supply $V_{cc}$ and the collectors of transistors 1 and 2 respectively. Transistor 8 has its base connected to collector of the transistor 2. Transistor 9 has its base connected to the collector of transistor 1. The emitters of transistors 8 and 9 are connected together, and connected between the common connection node and ground is a variable current source 10 capable of passing a variable current $I_G$. Transistor 11 is connected between the power supply $V_{cc}$ and the collector of the transistor 8, and also connected to diode 6 and 7. Transistor 12 is connected between the power supply $V_{cc}$ and transistor 9. An output current Io is generated through the common connection node of transistors 9 and 12.

In operation, input signal V is applied to the base of transistor 1, and then the applied input signal V is converted into a current signal by transistors 1 and 2. This converted current signal is converted into a logarithmic signal by diodes 6 and 7 and the, the two logarithm-converted signals are applied to the bases of transistors 8 and 9. The output current $I_O$ is determined, based on the product of the voltage between the bases of the transistors 8 and 9 and the variable current $I_G$ is thus output through the collector of transistor 9.

This operation of the amplification circuit shown in FIG. 1 gives rise to the following problems related to its linearity. Resistor 5 is connected between the emitters of transistors 1 and 2, the non-linear internal resistance of the emitters of transistors 1 and 2 cannot be ignored, when input signal V is converted into a current signal. More specifically, when the emitter current of the transistor 1 is $I_E$, the emitter resistance of the transistors 1 and 2 is $r_E$, and the resistance value of the resistor 5 is R, $I_E$ is represented by the following equation.

$$I_E = (V - V_B)/(R + 2 \cdot r_e) \tag{1}$$

In order to improve the linearity of the current conversion conducted by the transistors 1 and 2, it is necessary to reduce the effect of the internal resistance of the emitter $r_e$ on the emitter current $I_E$. It is necessary to reduce the internal resistance of the emitter $r_e$ by either making the value R of the resistance 5 represented by $R >> 2 \cdot r_e$, or increasing the emitter current $I_E$. However, the former approach decreases the gain of the amplification circuit. On the other hand, the latter approach causes increased current consumption. As a result, it is not possible to improve the linearity as well as to secure the wide dynamic range, without causing a decrease of the gain of the circuit or increasing the current consumption.

FIG. 2 is a circuit diagram of a conventional multiplying circuit utilizing the differential amplifier indicated in FIG. 1. Referring to FIG. 2, this multiplying circuit comprises a first differential amplifier having npn transistors 103, 104, 106 and 107, and a resistor 108; a current mirror circuit with pnp transistors 109 and 110; a current mirror circuit with pnp transistors 111 and 112; a multiplier having pnp transistors 121, 122, 123 and 124; and a second differential amplifier with pnp transistors 16 and 117 and resistor 118. This multiplication circuit receives the input signals $V_L$ and $V_R$ to generate an output current $I_{OUT}$ determined by multiplication of $V_L$ and $V_R$.

In operation, as the input signal $V_L$ is applied to the base of transistor 106, the input signal $V_L$ is converted into a current signal by transistors 106, 107, and resistor 108. The collector current of transistor 106 is applied to the emitters of transistors 121 and 122 through the transistors 109 and 110. The collector current of transistor 107 is applied to the emitters of transistors 123 and 124 through transistors 111 and 112.

As the input signal $V_R$ is applied to the base of the transistor 116, the signal is converted into a current signal by transistors 116, 117, and resistor 118. The individual collector currents of transistors 116 and 117 are converted into logarithmic signals by diodes 119 and 120 respectively. The two converted signals are applied to the bases of transistors 122 and 123, and the bases of transistors 121 and 124 respectively. As a result, multiplication of $V_L$ and $V_R$ is carried out by transistors 121, 122, 123 and 124 whereby current $I_{OUT}$ is obtained.

The multiplication circuit indicated in FIG. 2 also creates a similar problem to that which occurs in the amplification circuit indicated in FIG. 1. In the multiplication circuit indicated in FIG. 2, the resistor 108 is connected between the emitters of transistors 106 and 107 which form the first differential amplifier. The non-linear emitter resistance of transistors 106 and 107 included therein therefore cannot be ignored, when the input signal $V_L$ is converted into a current signal. Likewise, as the resistance 118 is connected between the emitters of transistors 116 and 117, in current conversion of the input signal $V_R$, the non-linear emitter resistance of transistors 116 and 117 cannot be ignored.

More practically, when the emitter current of transistors 106 and 116 are $I_{E1}$ and $I_{E2}$ respectively, the internal resistance each of the emitters of transistors 106, 107, 116 and 117 is $r_e$, and each resistance value of resistors 108 and 118 are R1 and R2 respectively, $I_{E1}$, $I_{E2}$ and $I_{OUT}$ will be represented by the following equations.

$$I_{E1} = (V_L - V_B)/(R1 + 2 \cdot r_e) \quad (2)$$

$$I_{E2} = (V_R - V_B)/(R2 + 2 \cdot r_e) \quad (3)$$

$$I_{OUT} = 2 \cdot I_{E1} \cdot I_{E2} / I_D \quad (4)$$

When equations (2) and (3) are substituted in equation (4), the following equation can be obtained.

$$I_{OUT} = 2 \cdot \{(V_L - V_B)/(R1 + 2 \cdot r_e)\} \cdot \{(V_R - V_B)/(R2 + 2 \cdot r_e)\} \cdot (1/I_D) \quad (5)$$

As is the case with the amplification circuit indicated in FIG. 1, it is preferable for the value $2 \cdot r_e$ to be negligible, in order to secure good linearity of the multiplication circuit indicated in FIG. 2.

It is necessary therefore for each internal resistance of the emitter $r_e$ of the transistors 106, 107, 116 and 117 to be reduced by making the relation of the values represented by $R1 >> 2 \cdot r_e$ and $R2 >> 2 \cdot r_e$ or by increasing the emitter currents $I_{E1}$ and $I_{E2}$. However, in the former case, decrease in the gain of the multiplication circuit indicated in FIG. 2 cannot be avoided. In the latter case, however an undesirable increase in current consumption is unavoidable.

SUMMARY OF THE INVENTION

One object of the present invention is to improve the linearity in an amplification circuit including a differential amplifier for securing a wide dynamic range.

An additional object of the present invention is to improve the linearity of an amplification circuit including a differential amplifier, without causing decrease in the gain.

Another object of the present invention is to improve the linearity of an amplification circuit including a differential amplifier, without causing an increase in current consumption.

Yet another object of the present invention is to improve the linearity of a multiplication circuit including a differential amplifier without causing decrease in the gain.

A further object of the present invention is to improve the linearity of a multiplication circuit including a differential amplifier, without causing increase in current consumption.

The amplification circuit in accordance with the present invention comprises a current conversion circuit for converting an applied input signal into a current signal, and a first differential amplifier including first and second bipolar transistors. The first and second bipolar transistors have their emitters connected together, and the first bipolar transistor has its base connected to receive the current signal converted by the current conversion circuit. This amplification circuit further comprises a comparison circuit for comparing the base potential of the first bipolar transistor and a predetermined potential, and a voltage control circuit for controlling the voltage between the base and emitter of the first bipolar transistor. The second bipolar transistor has its base connected to receive an output signal generated from the comparison circuit.

In operation, the voltage control circuit responds to the comparison circuit and then controls the voltage between the base and emitter of the first bipolar transistor forming the first differential amplifier, thereby keeping the emitter resistance of the first bipolar transistor constant. As the first bipolar transistor is responsive only to the current signal converted by the current conversion circuit to operate, the linearity between the input signal and the output signal can be improved.

In one aspect of the present invention, the multiplication circuit comprises the current conversion circuit for converting a first input signal into a current signal, and the first differential amplifier including the first and second bipolar transistors. The first and second bipolar transistors have their emitters connected together. The first bipolar transistor has its base connected to receive the current signal converted by the current conversion circuit. This multiplication circuit further comprises a comparison circuit for comparing the base potential of the first bipolar transistor and a predetermined potential, a voltage control circuit controlling the voltage between the base and emitter of the first bipolar transistor, and a second differential amplifier including third and fourth bipolar transistors. The second bipolar transistor has its base connected to receive an output signal generated from the comparison circuit. The third bipolar transistor has its base connected to receive a second input signal. The fourth bipolar transistor has its base connected to the predetermined potential. This multiplication circuit further comprises a multiplication circuit for multiplying output signals generated from the first and second differential amplifiers.

The foregoing and other objects, features, aspects and advantages of the present invention will become more apparent from the following detailed description of the present invention when taken in conjunction with the accompanying drawings

DESCRIPTION OF THE PREFERRED EMBODIMENTS

Figure 3:
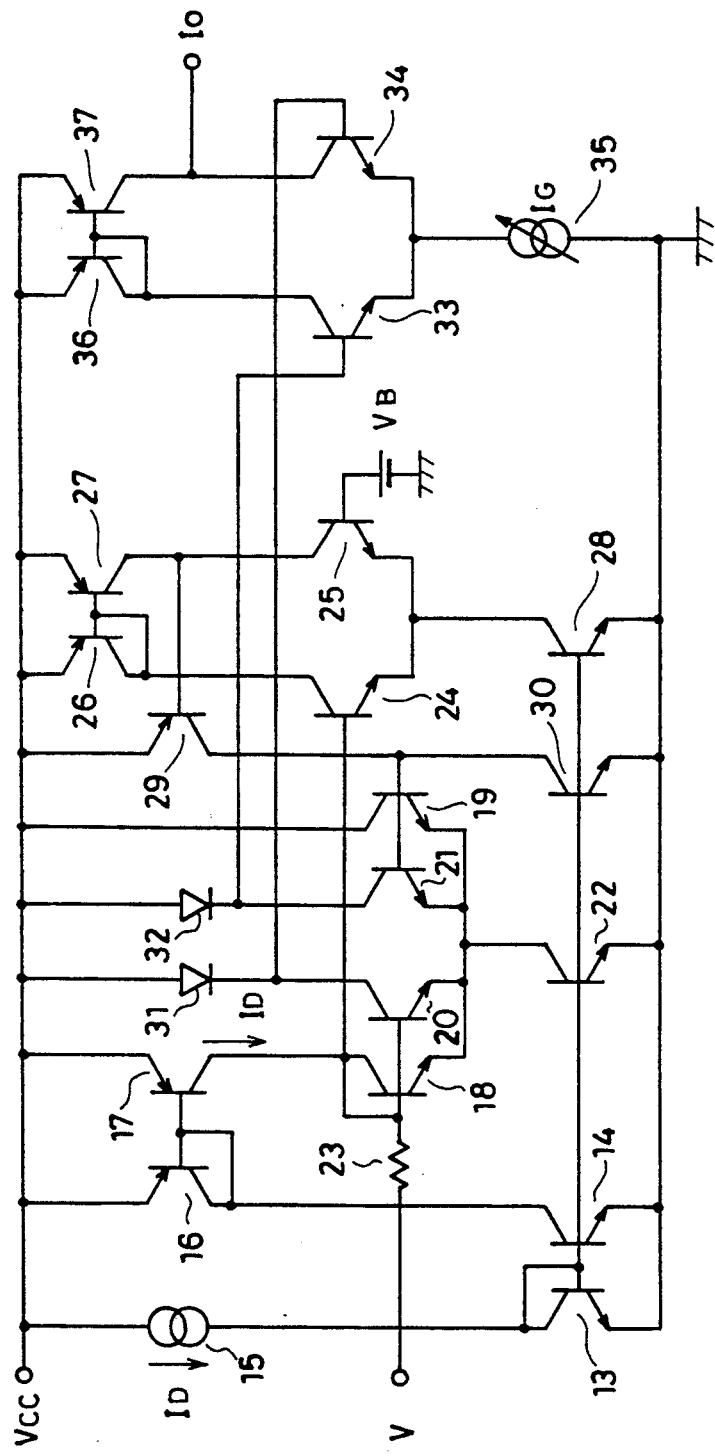
FIG. 3 is a circuit diagram of an amplification circuit in accordance with the present invention.

FIG. 3 illustrate one embodiment of an amplification circuit in accordance with the present invention, comprising a first differential amplifier composed of npn transistors 20, 21 and 22, a second differential amplifier composed of npn transistors 18, 19 and 22, a logarithm conversion circuit composed of diodes 31 and 32, a third differential amplifier composed of npn transistors 33, 34, and a variable current source 35 passing a variable current $I_G$ and, a fourth differential amplifier composed of npn transistors 24, 25 and 28. A current mirror circuit is composed of npn transistors 13, 14, 22, 28 and 30.

A constant current source 15 which passes a predetermined constant current $I_D$ and a diode connected npn transistor 13 are connected in series between power supply $V_{cc}$ and ground. The emitters of transistors 13 and 14 are grounded. Pnp transistors 16 and 17 composing a current mirror circuit are connected together to power supply $V_{cc}$. The diode connected transistor 16 has its collector connected to the collector of transistor 14. The current $I_D$ therefore flows through the collector of transistor 17.

Transistor 18 has its collector connected to the collector of transistor 17. Transistor 19 has its collector connected to the power supply $V_{cc}$. Since transistor 18 has its collector and base connected together, the collector output is all fed back to the base. The bases of transistors 18 and 20 are connected together and the common connection node thereof is connected to receive an input signal V through resistor 23. Transistors 18, 19, 20 and 21 have the emitters connected together, and transistor 22 is connected between the common connection node and ground. Transistor 22 is 4 times larger than transistor 14, and acts as a constant current source. Transistor 22 has its base connected to the base of transistor 14.

Transistor 24 has its base connected to the base of transistor 18. Transistor 25 has its base connected to receive a predetermined constant voltage $V_B$. Transistors 24 and 25 have the emitters connected together, and transistor 28 is connected between the common connection node and ground. Transistor 28 has its base connected to the base of the transistor 14, resulting in transistor 28 acting as a constant current source. A current mirror circuit is composed of pnp transistors 26 and 27. Diode-connected transistor 26 is connected between power supply $V_{cc}$ and the collector of transistor 24. Transistor 27 is connected between the power supply $V_{cc}$ and the collector of the transistor 25.

A pnp transistor 29 is connected between power supply $V_{cc}$ and the collector of transistor 30 thereby forming a negative feed back circuit. That is, transistor 29 has its base connected to the collector of transistor 25, its emitter connected to the power supply, and its collector connected to the base of transistor 19.

A diode 31 is connected between the power supply and the collector of transistor 20. A diode 32 is connected between the power supply $V_{cc}$ and the collector of transistor 21. Each base of transistors 33 and 34 are connected to the cathodes of diodes 32 and 31 respectively. A current mirror circuit is composed of pnp transistors 36 and 37. Diode-connected transistor 36 is connected between power supply $V_{cc}$ and the collector of transistor 33. Transistor 37 is connected between power supply $V_{cc}$ and the collector of transistor 34.

The above described circuit operates as follows: An input signal V is converted into a current signal by resistor 23. The first differential amplifier having of transistors 20, 21 and 22 responds to the converted current signal, and provides an output signal. This output signal is converted into logarithm signals by diodes 31 and 32, and the converted signals are supplied to the bases of transistors 33 and 34 respectively. As a result, the third differential amplifier composed of transistors 33, 34, and variable current source 35 converts the logarithmic signal into an exponential function. The output current Io which does not include logarithmic and exponential functions is thus generated.

Figure 1:
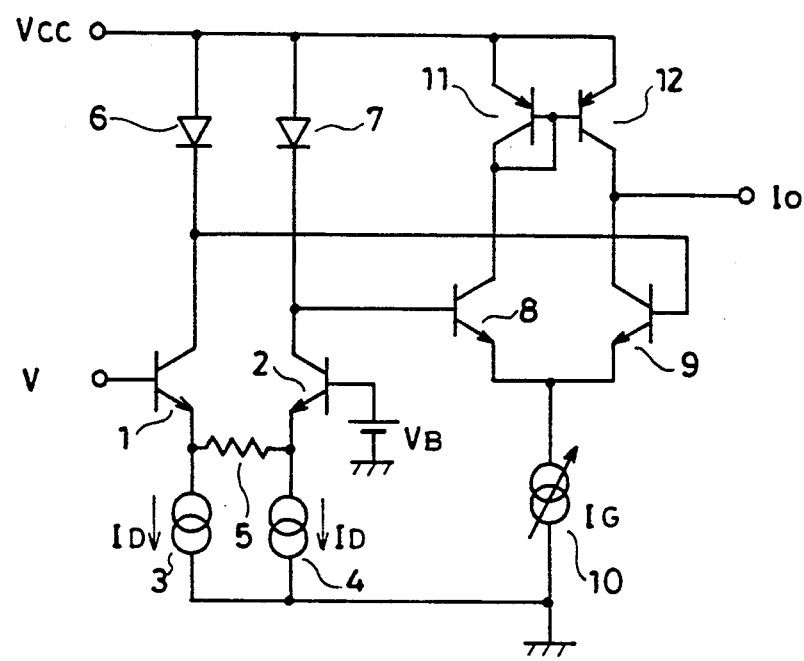
FIG. 1 is a circuit diagram of a conventional amplification circuit.

In the above mentioned amplification, it is pointed out that the base of transistor 20 is provided with negative feed back, and the base potential of the transistor 20 is kept at a virtual ground potential. When the base current of transistor 20, i.e. the base current of transistor 18 increases, the base current of transistor 24 increases accordingly. Since much more collector current flows through transistors 26 and 27 in response to the increase in the base current of transistor 24, the base current of transistor 29 is increased. The base current of transistor 19 is decreased and the base current of transistor 18 is decreased accordingly. On the other hand, when the base current of transistor 18 decreases, the base current of transistor 24 decreases accordingly. Since much less collector current is conducted through transistors 25, 26 and 27, the base current of the transistor 29 is decreased. The base current of the transistor 19 is thus increased, and the base current of the transistor 18 is increased accordingly. Based on the above description it becomes evident that the first differential amplifier, composed of transistors 18, 19 and 22, is always provided with negative feed back. The base current of transistor 20 is thus kept at a constant potential, i.e. at a virtual ground potential. As a result, since the collector current of transistor 18 becomes constant, voltage $V_{BE}$ between the base and emitters of transistors 18 and 20 are kept at a constant value. The internal resistance of the emitter $r_e$ of transistors 18 and 20 are therefore kept constant. The input signal V is to be converted into a current signal only by resistor 23, without taking into consideration of the non-linear internal resistance of the emitter $r_e$ of transistors 18 and 20. As seen from the foregoing equation (1), with $r_e$ kept at a constant value, the emitter current $I_E$ changes in proportion with the input signal V. As a result, improvement can be achieved on the linearity between the input and output of the first differential amplifier composed of transistors 20, 21 and 22, whereby the overall linearity of the amplification circuit indicated in FIG. 3 can be improved in comparison to the conventional circuit indicated in FIG. 1.

The following is a description of the specific operation of the other circuit portions in the amplification circuit indicated in FIG. 3. As mentioned above, the amplification circuit indicated in FIG. 3 comprises the logarithm conversion circuit composed of diodes 31 and 32, and the exponent conversion circuit composed of transistors 33, 34, 36 and 37, and, variable current source 35. Each of diode 31 and 32 converts the collector currents of transistor 20 and 21 into logarithmic signals respectively. When the voltage between the cathodes of diodes 31 and 32 is $\Delta V_{BE}$, $\Delta V_{BE}$ will be represented by the following equation:

$$\Delta V_{BE} = 2 \cdot V_T \log (I_{E1}/I_S) \qquad (6)$$

where, $V_T$ is a constant, $I_{E1}$ is an output current, and $I_S$ is a backward saturation current of the diodes 31 and 32.

The logarithmic signal converted by diodes 31 and 32, i.e. the voltage $\Delta V_{BE}$ is supplied between the bases of transistors 33 and 34. When the output current of transistor 36 is $I_{E2}$, $I_{E2}$ will be represented by the following equation.

$$I_{E2} = I_S \cdot \exp(\Delta V_{BE}/2 \cdot V_T) \tag{7}$$

When equation (6) is substituted in equation (7), the voltage $I_{E2}$ is represented without including the logarithmic and exponential functions. Thus the output current Io represented by the following equation is generated.

$$Io = (V - V_B)/R \cdot I_G/ID \tag{8}$$

where R represents the resistance value of resistor 23.

The output current Io determined in accordance with the product (linear multiplication) of input signal V and current value $I_G$ can be obtained, by changing the current value $I_G$ generated from the variable current source 35.

Figure 4:
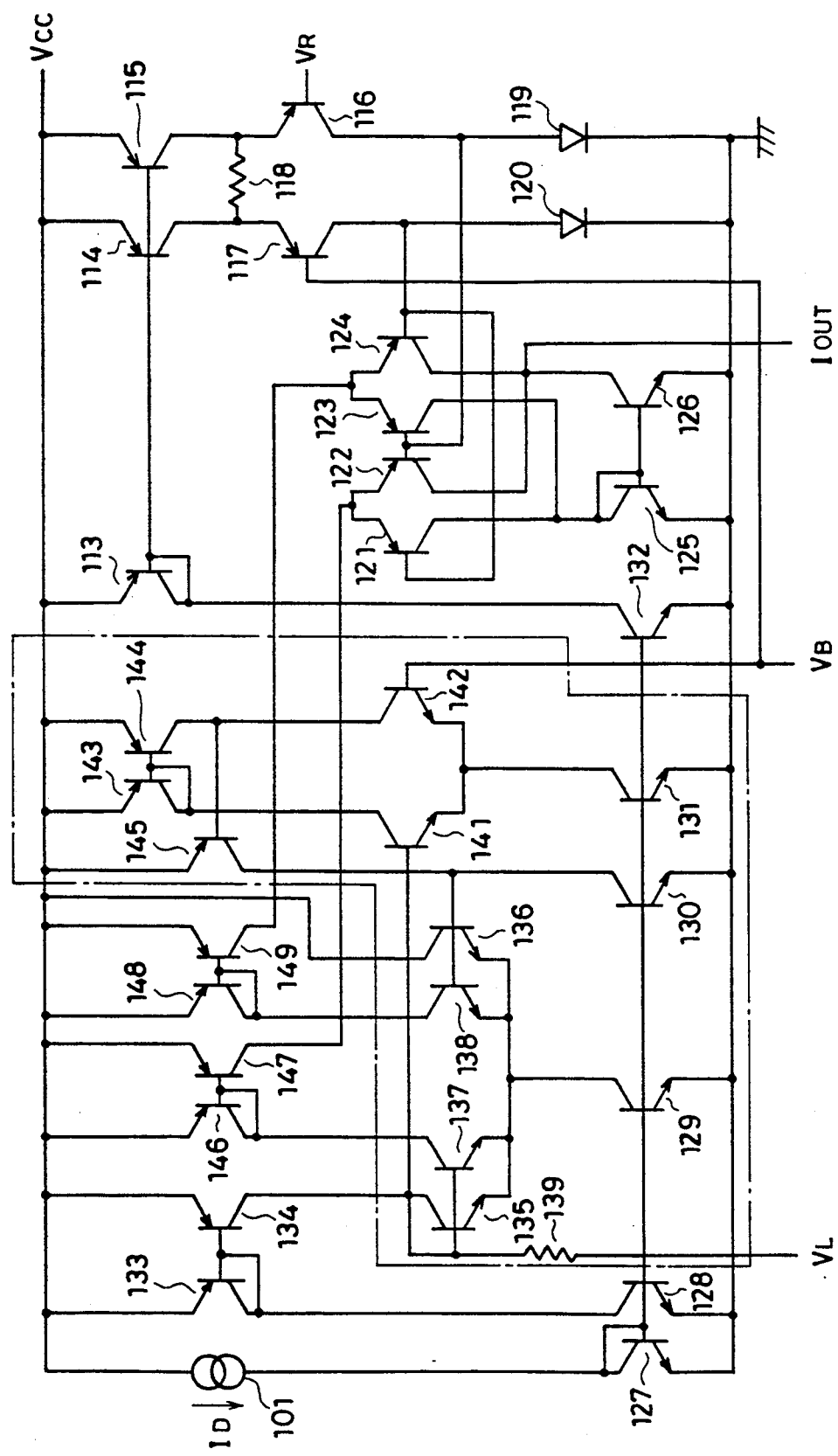
FIG. 4 is a circuit diagram of a multiplication circuit in accordance with the present invention.

Another embodiment of the multiplication circuit in accordance with the present invention is indicated in FIG. 4. As is the case with the amplification circuit indicated in FIG. 3, in this multiplication circuit the linearity is improved by making use of negative feed back circuit. Referring to FIG. 4, this multiplication circuit comprises a first differential amplifier composed of npn transistors 137, 138 and 129; a second differential amplifier composed of npn transistors 135, 136 and 129; a third differential amplifier composed of npn transistors 141, 142 and 131; a multiplier composed of pnp transistors 121, 122, 123 and 124; and a fourth differential amplifier composed of pnp transistors 114, 115, 116 and 117 and resistor 118. A current mirror circuit is formed of npn transistors 127, 128, 129, 130, 131 and 132. In addition to this, a current mirror circuit is composed of pnp transistors 113, 114 and 115.

Diode-connected transistor 127 has its collector connected to receive a constant current $I_D$ through a constant current source 101. The emitters of transistors 127 to 131 are grounded. Transistor 129 is 4 times larger than transistors 127, 128, 130, 131 and 132. A current mirror circuit is composed of pnp transistors 133 and 134. Diode-connected transistor 133 has its collector connected to the collector of transistor 128. The emitters of transistors 133 and 134 are connected to power supply $V_{cc}$.

Transistor 135 has its collector connected to the collector of transistor 134. Transistor 136 has its collector connected to power supply $V_{cc}$. Since transistor 135 has its collector and base connected together, the collector output is all fed back to the base. The base of transistor 135 is connected to receive a first input signal $V_L$ through a resistor 139 for current conversion.

The base of transistor 137 is connected to the base of transistor 135.

The base of transistor 138 is connected to that of transistor 136. Transistors 135, 136, 137 and 138 have their emitters connected together at a common connection node, and transistor 129 is connected between this node and ground.

The base of the transistor 141 is connected to the collector of transistor 135. Transistor 142 has its base connected to a predetermined constant voltage $V_B$. Transistors 141 and 142 have their emitters connected together at another common connection node and transistor 131 is connected between this node and ground.

Pnp transistors 143 and 144 form a current mirror circuit. have their emitters connected to power supply $V_{cc}$. Each collector of transistors 143 and 144 are connected to the collectors of transistors 141 and 142 respectively. The pnp transistor 145 for negative feed back has its base connected to the collector of transistor 144, its emitter connected to the power supply $V_{cc}$, and its collector connected together to the base of transistor 136 and the collector of transistor 130.

As is the case with the amplification circuit indicated in FIG. 3, the following is a description of how negative feed back for improving linearity works in the above described circuit. First, when the base current of transistor 135 is increased, the base current of transistor 141 is increased. Since more collector current is conducted through transistors 142, 143 and 144 accordingly, the base current of transistor 145 is increased. The base current of transistor 136 is thus reduced, and the base current of transistor 135 is reduced accordingly. In contrast, when the base current of transistor 135 is reduced, the base current of transistor 141 is reduced. As less collector current passes through transistors 143 and 144, the base current of transistor 145 is reduced. Thus the base current of transistor 136 is increased, the base current of transistor 135 is to be increased accordingly.

As seen from the description above, it is indicated that transistors 135 and 137 always have their bases provided with negative feedback. Furthermore, as transistor 135 undergoes not only a negative feedback but also a total feedback, the base of transistor 135 is brought to a constant potential, i.e. a virtual ground potential. As a result, the supply of an AC signal component to the base of transistor 135 can be prevented. The base emitter voltage $V_{BE}$ of the transistor 137 is therefore kept at a constant value by negative feed back operation. Thus, the internal resistance of the emitter $r_e$ of transistor 137 does not change in accordance with the change of the emitter current $I_E$. Since transistor 137 responds only to the current signal converted by resistor 139, good linearity can be secured between the input and the output of the first differential amplifier composed of transistors 137, 138 and 129.

Pnp transistors 146 and 147 form a current mirror circuit. The emitters of transistors 146 and 147 are connected to the power supply $V_{cc}$. Diode-connected transistor 146 has its collector connected to the collector of transistor 137. Transistor 147 has its collector connected to the emitters of the transistor 121 and 122. The collector current of transistor 137 is therefore applied to the emitters of transistors 121 and 122 through transistors 146 and 147.

Pnp transistors 148 and 149 form a current mirror circuit. Transistors 148 and 149 have their emitters connected to the power supply $V_{cc}$. Diode-connected transistor 148 has its collector connected to the collector of transistor 138. The collector of transistor 149 is connected to the emitters of transistors 122 and 124. The collector current of transistor 138 is therefore applied to the emitters of transistors 123 and 124 through transistors 148 and 149.

When the emitter current of transistors 121, 122, 123 and 124 is $I_{E3}$, $I_{E3}$ is represented by the following equation.

$$I_{E3} = I_S \cdot \exp(V_{BE}/V_T) \tag{9}$$

where, is a backward saturation current, $V_{BE}$ is the voltage between base and emitter, and $V_T$ is a constant.

As seen from equation (9), it is indicated that the emitter current $I_{E3}$ was converted into an exponential signal.

Transistors 114, 115, 116, 117, resistor 118, and diodes 119 and 120 form a logarithm conversion circuit. When the voltage between both terminals of diodes 119 and 120 is $\Delta V_{BE}'$, $\Delta V_{BE}'$ is represented by following equation.

$$\Delta V_{BE}' = 2 \cdot V_T \log(I_{E4}/I_S) \quad (10)$$

where $I_{E4}$ is the output current.

Since a second input signal $V_R$ applied to the base of the transistor 116 is converted into a logarithmic signal after current conversion, the wide dynamic range of the input signal $V_R$ can be secured.

A fifth differential amplifier composed of the transistors 121, 122, 123 and 124 is supplied with the collector output of transistors 147 and 149, and the collector output of transistors 116 and 117. By substituting equation (10) in equation (9), the emitter current $I_{E3}$ will be removed of both logarithmic function and exponential function. The fifth differential amplifier therefore generates an output current $I_{OUT}$ which does not follow the logarithmic function and exponential function. The output current $I_{OUT}$ can be obtained, which is determined by the multiplication (linear multiplication) of the first input signal $V_L$ and the second input signal $V_R$.

In the multiplication circuit indicated in FIG. 4, the linearity between the input and the output of the differential amplifier is improved in the above mentioned manner, in order to expand the dynamic range of the first input signal $V_L$. Similarly, also in order to expand the dynamic range of the second input signal $V_R$, a circuit surrounded by a chain dotted line in FIG. 4 is provided in place of the transistors 116, 117 and the resistor 118.

Figure 2:
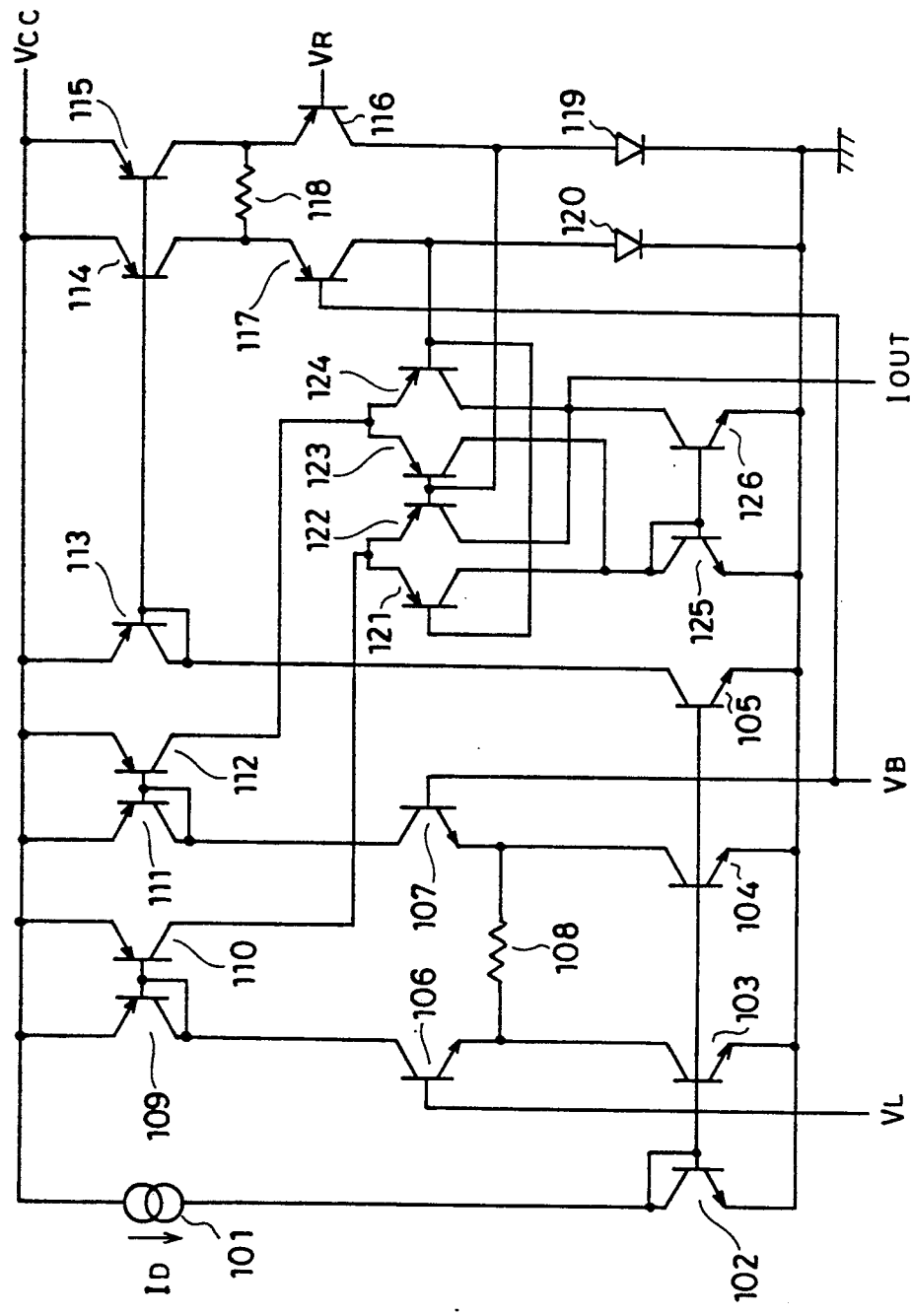
FIG. 2 is a circuit diagram of a conventional multiplication circuit

As mentioned above, of either of the circuits in FIGS. 3 and 4, the base of the transistor constituting the first differential amplifier is kept at a constant potential, and i.e. a virtual ground potential, the value of the internal resistance of the emitter $r_e$ does not change in accordance with the change of the emitter current. As a result, as the transistor responds only to the current signal based on the input signal, the linearity between the input and the output of the first differential amplifier is improved. As a result, the wide dynamic ranges of the amplification circuit and multiplication circuit indicated in FIGS. 3 and 4 are secured, thereby improving the linearity. Since the current does not need to be increased in reducing the effect of internal resistance of the emitter, current consumption is not increased. In addition to this, it is pointed out that as the non-linearity due to the internal resistance of the emitter can be ignored, it is not necessary to increase the resistance values of input resistor 23 indicated in FIG. 2 and input resistor 139 indicated in FIG. 4, thereby preventing the gain from being reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amplification circuit comprising:
   current conversion means for receiving an input signal and for converting the input signal into a current signal,
   a first differential amplifier means comprising first and second bipolar transistors,
   said first and second bipolar transistors having the emitters connected together,
   said first bipolar transistor having its base connected to receive the current signal converted by said current conversion means,
   comparison means connected to the base of said first bipolar transistor, for comparing the potential of the base of said first bipolar transistor and a predetermined first potential,
   said second bipolar transistor having its base connected to receive an output signal generated from said comparison means, and
   voltage control means responsive to said comparison means for controlling the voltage between the base and emitter of said first bipolar transistor.

2. A multiplication circuit for multiplying first and second input signals comprising;
   current conversion means for receiving the first input signal and for converting the first input signal into a current signal,
   first differential amplifier means including first and second bipolar transistors,
   said first and second bipolar transistor having their emitters connected together,
   said first bipolar transistor having its base connected to receive the current signal converted by said current conversion means,
   comparison means connected to the base of said first bipolar transistor for comparing the potential of the base of said first bipolar transistor and a predetermined first potential,
   said second bipolar transistor having its base connected to receive the output signal generated from said comparison means,
   voltage control means responsive to said comparison means for controlling the voltage between the base and emitter of said first bipolar transistor,
   second differential amplifier means including third and fourth bipolar transistors,
   said third bipolar transistor having its base connected to receive said second input signal,
   said fourth bipolar transistor having its base connected to said predetermined first potential, and
   multiplier means connected between the outputs of said first and second differential amplifier means for multiplying the output signals generated from said first and second differential amplifier means.

3. An amplification circuit comprising;
   current conversion means for receiving an input signal and for converting the input signal into a current signal, and
   first differential amplifier means including first and second transistors, the input of said first transistor receiving the current signal, the output signal of said first transistor being fed back to the input of said first transistor,
   second differential amplifier means including third and fourth transistors, the input of said third transistor receiving said current signal, the input of said fourth transistor receiving a predetermined signal, and
   negative feed back means for receiving the output signal of the second differential amplifier means and for performing negative feed back of the negative feed back signal to the input of said second transistor in response to the output signal of said second differential amplifier means, the middle point voltage of the input signal to said first transistor being constant.

4. The amplification circuit according to claim 3, comprising;

third differential amplifier means including fifth and sixth transistors, the input of said fifth transistor receiving said current signal, the input of said sixth transistor receiving the negative feed back signal of said negative feed back means, logarithm conversion means connected to the output of said third differential amplifier means for converting the output signal of the third differential amplifier means into a logarithmic signal, and exponent conversion means connected to the output of said logarithm conversion means for exponent-converting said logarithmic signal.

5. The amplification circuit according to claim 4, wherein said logarithm conversion means comprises;

first diode means connected between the power supply and the output of said fifth transistor, and second diode means connected between the power supply and the output of said sixth transistor.

6. The amplification circuit according to claim 5, wherein said exponent conversion means comprises;

fourth differential amplifier means including seventh and eight transistors, said seventh transistor has its input connected to the output of said first diode means, said eight transistor has its input connected to the output of said second diode means.

7. The amplification circuit according to claim 3, wherein said current conversion means comprises resistor means connected to the input of said first transistor, said first transistor receiving said input signal through said resistor means.

8. The multiplication circuit for multiplying first input signal and second input signal comprising:

current conversion means for receiving said first input signal and for converting the first input signal into a current signal, first differential amplifier means including first and second transistors, the input of said first transistor receiving said current signal, the output signal of said first transistor being fed back to the input of said first transistor, second differential amplifier means including third and fourth transistors, the input of said third transistor receiving said current signal, the input of said fourth transistor receiving a predetermined signal, negative feed back means for receiving the output signal of the second differential amplifier means and for performing negative feed back of the negative feed back signal to the input of said second transistor in response to the output signal of said second differential amplifier means, third differential amplifier means including fifth and sixth transistors, the input of said fifth transistor receiving said current signal, the input of said sixth transistor receiving the negative feed back signal of said negative feed back means, fourth differential amplifier including seventh and eighth transistors, the input of said seventh transistor receiving said second input signal, the input of said eighth transistor receiving said predetermined said signal, and multiplier means connected between the output of said third differential amplifier means and the output of said fourth differential amplifier means for generating the output signal based on the product of said first input signal and said second input signal.

* * * * *